United States Patent [19]

Pickrell

[11] Patent Number: 4,846,902

[45] Date of Patent: Jul. 11, 1989

[54] SOLID DIFFUSION SOURCE OF GD OXIDE/P205 COMPOUND AND METHOD OF MAKING SILICON WAFER

[75] Inventor: Gary R. Pickrell, Toledo, Ohio

[73] Assignee: Owens-Illinois Television Products Inc., Toledo, Ohio

[21] Appl. No.: 195,940

[22] Filed: May 19, 1988

[51] Int. Cl.$^4$ .......................................... H01L 21/225
[52] U.S. Cl. ................................... 148/033; 252/951; 437/168; 423/263
[58] Field of Search .................. 148/33; 252/950, 951; 437/168, 169; 423/263, 299, 305

[56] References Cited

U.S. PATENT DOCUMENTS

| | | | |
|---|---|---|---|
| 4,000,247 | 12/1976 | Yamada et al. | 423/263 |
| 4,025,464 | 5/1977 | Yamashita et al. | 252/950 |
| 4,033,790 | 7/1977 | Gunjigake et al. | 252/950 |
| 4,141,738 | 2/1979 | Rapp | 437/168 |
| 4,152,286 | 5/1979 | Crosson et al. | 252/950 |
| 4,160,672 | 7/1979 | Rapp | 252/950 |
| 4,175,988 | 11/1979 | Rapp | 252/950 |

*Primary Examiner*—Olik Chaudhuri

[57] ABSTRACT

A doping composition having a high rate of $P_2O_5$ evolution as indicated by a thick deposited glassy film of about 1500–2000 angstroms at a doping temperature of only 900° C. for one hour, the composition comprising a gadolinium oxide/$P_2O_5$ compound.

13 Claims, No Drawings

SOLID DIFFUSION SOURCE OF GD OXIDE/P2O5 COMPOUND AND METHOD OF MAKING SILICON WAFER

This invention relates to a solid diffusion source composition comprising a Gd oxide/$P_2O_5$ compound and a method of using the same to make a doped silicon wafer.

BACKGROUND OF THE INVENTION

A solid diffusion source comprising glass ceramic or polycrystalline particles is disclosed in the Rapp U.S. Pat. No. 4,141,738. In U.S. Pat. No. 4,033,790 there is disclosed solid diffusion sources made by hot pressing $La_2O_3/P_2O_5$, $Ce_2O_3/P_2O_5$ and $Y_2O_3/P_2O_5$ compounds. The above U.S. patents are incorporated by reference.

It is desirable to provide a solid diffusion source that can be easily prepared without hot pressing, the diffusion source being made from a composition that evolves $P_2O_5$ at a relatively low temperature at a relatively high rate.

OBJECTS OF THE INVENTION

It is an object of the invention to provide a doping composition for a solid diffusion source to provide a coated silicon wafer, the composition comprising a Gd oxide/$P_2O_5$ compound that evolves $P_2O_5$ at a relatively low temperature at a relatively high rate.

It is an object of the invention to provide a method of making a doped silicon wafer using a solid diffusion source, the method comprising the steps of:

A. heating Gd oxide and $H_3PO_4$ to provide a Gd oxide/$P_2O_5$ composition; and B. firing the composition to evolve $P_2O_5$ to a silicon wafer at a relatively low temperature.

These and other objects of the present invention will be apparent from the specification that follows and from the appended claims.

SUMMARY OF THE INVENTION

The present invention provides a novel solid diffusion source composition that comprises a Gd oxide/$P_2O_5$ compound that evolves $P_2O_5$ at a relatively low temperature, say 700° C. to 1050° C. and at a relatively high rate as indicated by the deposit of thick film on a silicon wafer, the film being of a thickness of about 1500–2000 Å (angstroms) at 900° C. for 1 hour as compared to only 500 Å using a $La_2O_3/P_2O_5$ at the same temperature for the same time.

The present invention also provides a method of making a doped silicon wafer using a solid diffusion source, the method comprising the steps of:

A. heating Gd oxide and $H_3PO_4$ to provide a Gd oxide/$P_2O_5$ composition diffusion source; and B. firing the composition to evolve $P_2O_5$ to a silicon wafer at a relatively low temperature and at a relatively high rate.

The present invention also provides a doped silicon wafer prepared from the Gd/$P_2O_5$ compound by the method just described.

DETAILED DESCRIPTION OF THE INVENTION

In general, the gadolinium oxide/$P_2O_5$ diffusion source composition has a molar ratio of Gd oxide/$P_2O_5$ of about 1:1 to 1:5 and preferably 1:3 to 1:5. Usually the best results are obtained with a molar ratio of about ⅓ for gadolinium metaphosphate and 1/5 in the case of gadolinium pentaphosphate.

EXAMPLE 1

Gadolinium pentaphosphate diffusion sources were prepared as follows:

(1) Mixing stoichiometric proportions of the Gd oxide with phosphoric acid (molar ratio of Gd oxide/$P_2O_5$ of 1:5), with an excess of phosphoric acid.

(2) Heating to 350° C. to drive off excess water.

(3) Firing in covered crucible at 750° C. for 15 hours.

(4) Removing material and grinding to a fine powder (60 mesh or finer).

(5) Removing a sample of the powder for X-ray diffraction (XRD) testing, if desired.

(6) Casting (appropriate powder/water mix to form a pourable mixture into a green wafer form. (15 grams of powder to 5 grams of water)

(7) Sintering the green wafer into a rigid disk that is a source wafer.

(8) Testing the source wafers for doping characteristics, and using the wafers in a semiconductor device.

A Philips 3100 X-ray diffractometer equipped with a copper tube (copper α unresolved) and curved crystal monochrometer was used for crystalline phase analysis.

The X-ray pattern obtained on gadolinium pentaphosphate sample match very well with data published for gadolinium pentaphosphate.

The Gd oxide/$P_2O_5$ composition compounds in the XRD patterns appear to be reacted sufficiently at 750° C. for 15 hours.

Doping tests on gadolinium pentaphosphate (900° C.) (1 Hr.); $N_2=3$ min.) were made using a silica boat for the diffusion of the source to silicon wafers.

A lanthanum oxide:$5P_2O_5$ compound diffusion source was also tested for a comparison with gadolinium pentaphosphate source.

The gadolinium pentaphosphate produced an unexpected thick glassy film.

Table I summarizes data obtained using gadolinium pentaphosphate.

TABLE 1

| | Melting Pt., °C. - Doping 900° C. (1 Hr.) | | | |
|---|---|---|---|---|
| Rare Earth Oxide La = control | Penta-phosphate | Thickness of Deposited Film Å (Angstroms) | Sheet Resistivity Ohms/Sq. | Source Color |
| La | 1095 | 500 | | White |
| Gd | 800 | 1500–2000 | Lower than control | White |

It can be seen that surprisingly, the Gd oxide/$P_2O_5$ compound source produced a deposited film thickness that was 3 to 5 times as thick as the La oxide/$P_2O_5$ source at the same temperature and same time.

The $P_2O_5$ evolution of the Gd oxide/$P_2O_5$ composition source is generally at least two times and usually three to four or more times as fast as the La oxide/$P_2O_5$ source at a given temperature and for a given time.

The firing cycle to evolve $P_2O_5$ is from about 700° or 750° C. up to 1000° C. to 1050° C. or more and preferably 750° C. to 1050° C. for generally about ¼ hour to 24 hours or more and preferably about ½ to 2 hours.

The gadolinium oxide/$P_2O_5$ compound, before casting and firing, preferably has a fine particle size, generally 60 mesh or finer and preferably about 100 mesh to 400 mesh. Preferably the finely divided particles are mixed with a small amount of water to provide a viscous slurry that is a pourable mixture for forming the diffusion source wafer in a source wafer mold. Generally the weight ratio of powder/water is about 5/1 to about 1/1. The source wafer itself generally has a thickness of about 5 to 200 mils or more depending upon the diameter.

When the silicon wafer is produced from the source wafer, the sheet resistivity of the doped silicon wafer is about 1 to 200 ohms/square depending upon temperature and time. The thicker (1000 to 1500 up to 2000 to 3000 angstroms) deposited films at 900° C. for 1 hour provide higher phosphorus concentrations in the final silicon wafer.

The resultant doped wafers can be used in a typical emitter, in channel MOS and in polysilicon diffusions without undesirable toxic gases and liquids.

The gadolinium pentaphosphate solid diffusion source operates according to the following decomposition reaction:

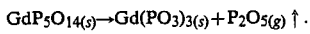

$$GdP_5O_{14(s)} \rightarrow Gd(PO_3)_{3(s)} + P_2O_{5(g)} \uparrow .$$

The reaction proceeds at a sufficient rate to be used as a dopant source between about 700° and 1050° C. Specific values of the evolution rate (weight loss) as a function of time at a given temperature (isothermal) will depend upon the particle size, particle packing, density, open porosity, sample geometry and many other factors.

Gadolinium pentaphosphate is preferably prepared by dissolving $Gd_2O_3$ in 85% $H_3PO_4$ in a 1:5 weight ratio, in a carbon crucible at 350° C. After the excess water is evaporated, the crucible is covered and the temperature raised to 750° C. for 24 hours. Gd pentaphosphate crystals will grow from the solution. The crystals are ball milled until a fine powder is obtained (−60 mesh). The powder is then mixed with distilled water to provide a 3:1 powder to water weight ratio, the slurry cast in Teflon molds and dried at 50° C., fired between alumina plates at 900° C. for one hour and then tested. These wafers exhibit good thermal shock properties compared to the current phosphorous dopant sources.

What is claimed is:

1. A composition for a solid diffusion source to deposit a phosphorus oxide coating on a silicon wafer, the composition consisting essentially of a Gd oxide/$P_2O_5$ compound that evolves $P_2O_5$ at a relatively low temperature at a relatively high rate.

2. A composition as defined in claim 1 in which the mole ratio of Gd oxide/$P_2O_5$ is about 1/1 to 1/5.

3. A composition as defined in claim 1 in which the Gd oxide/$P_2O_5$ mole ratio is about ⅓ to 1/5.

4. A method of making a doped silicon wafer using a solid diffusion source, the method comprising the steps of:
   A. heating Gd oxide and $H_3PO_4$ to provide a Gd oxide/$P_2O_5$ composition; and
   B. firing the composition to evolve $P_2O_5$ to deposit a phosphorous containing coating on the silicon wafer at a relatively low temperature and at a relatively high rate to form a glassy layer on the silicon wafer.

5. A method as defined in claim 4 in which the glassy layer of step (B) is about 1000 to 3000 angstroms in thickness for a deposition at 900° C. for one hour.

6. A method of doping a silicon wafer comprising the steps of:
   (A) forming a doping source wafer for doping a silicon wafer with phosphorus, the source wafer being formed from a composition comprising:
      (a) 60 mesh or smaller particles of a gadolinium oxide/$P_2O_5$ compound in which the mole ratio of Gd oxide/$P_2O_5$ is about 1/1 to 1/5, and
      (b) sufficient water to form a viscous pourable slurry; and
   (B) firing the doping source wafer to form a glassy layer on the silicon wafer by the vapor phase transport of $P_2O_5$ to diffuse phosphorus into the silicon wafer.

7. A method as defined in claim 6 in which there is a further step of drying the source wafer of step (A) sufficiently to be water resistant and resistant to breakage by handling.

8. A method as defined in claim 7 in which the dried source wafer is subjected to a step of sintering the wafer at a temperature of about 850° C. to 1150° C. for 1 to 10 hours before firing the dried sintered wafer according to step (B).

9. A method as defined in claim 6 in which the doping wafer is formed in a fluorocarbon polymer mold, the wafer is dried within the mold, and the wafer removed and heat treated.

10. A method as defined in claim 7 in which the drying step is at a temperature of about 60° C. to 140° C., and the firing step is at a temperature of about 700° C. to 1050° C.

11. A method as defined in claim 6 in which the sheet resistivity of the final doped wafer is about 1 to 50 ohms per square for a firing time in step (B) of about one hour at 900° C.

12. A method as defined in claim 5 in which the sheet resistivity of the doped silicon wafer is about 10 to 35 ohms/square.

13. A doping source wafer for doping a silicon wafer with phosphorus, the source wafer being formed from a composition comprising:
   (a) 60 mesh or smaller particles of a gadolinium oxide/$P_2O_5$ compound in which the mole ratio of Gd oxide/$P_2O_5$ is about 1/1 to 1/5, and
   (b) sufficient water to form a viscous pourable slurry.

* * * * *